United States Patent [19]

Schwarz et al.

[11] Patent Number: 5,851,904
[45] Date of Patent: Dec. 22, 1998

[54] METHOD OF MANUFACTURING MICROCRYSTALLINE LAYERS AND THEIR UTILIZATION

[76] Inventors: Reinhard Schwarz, Daxenackerweg 23b, D-85748 Garching, Germany; Svetoslav Koynov, Veliko Tarnovo 9, 1504 Sofia, Bulgaria; Thomas Fischer, Freimanner Weg 7, D-85748 Garching, Germany

[21] Appl. No.: 624,403
[22] PCT Filed: Sep. 29, 1994
[86] PCT No.: PCT/DE94/01158
  § 371 Date: May 17, 1996
  § 102(e) Date: May 17, 1996
[87] PCT Pub. No.: WO95/09435
  PCT Pub. Date: Apr. 6, 1995

[30] Foreign Application Priority Data

Sep. 30, 1993 [DE] Germany .......................... 43 33 416.4

[51] Int. Cl.$^6$ .......................... H01L 21/20; H01L 21/36; C30B 00/00
[52] U.S. Cl. .......................... 438/482; 438/485
[58] Field of Search .............................. 437/101; 438/96, 438/97, 482, 485

[56] References Cited

U.S. PATENT DOCUMENTS

| | | |
|---|---|---|
| 4,686,110 | 8/1987 | Endo et al. . |
| 5,108,936 | 4/1992 | Ghannam et al. . |
| 5,206,523 | 4/1993 | Goesele et al. . |
| 5,458,735 | 10/1995 | Richter et al. . |
| 5,500,102 | 3/1996 | Ichikawa et al. ...................... 437/101 |
| 5,644,145 | 7/1997 | Ishihara ..................................... 257/52 |

FOREIGN PATENT DOCUMENTS

| | | |
|---|---|---|
| 0 526 779 A1 | 2/1993 | European Pat. Off. . |
| 40 19 988 A1 | 1/1991 | Germany . |

OTHER PUBLICATIONS

Hamasaki, et al., "Low–temperature crystallization of doped a–Si:H alloys", 37 Appl. Phys. Lett. 12 (1980), pp. 1084–1086.

Asano, "Effects of hydrogen atoms on the network structure of hydrogenated amorphous and microcrystalline silicon thin films", 56 Appl. Phys. Lett. 6 (1990), pp. 533–535.

Otobe, et al., "Growth Mechanism of Microcrystalline Silicon Prepared by Alternating Deposition of Amorphous Silicon and Hydrogen Radical Annealing", 31 Jpn. J. Appl. Phys. (1992), pp. 1388–1391.

Koynov et al., "Closed Chamber Chemical Vapor Deposition: New Cyclic Method for Preparation of Microcrystalline Silicon Films", 33 Jpn. J. Appl. Phys.(1994), pp. 4534–4539.

Asano et al., "Preparation of highly photoconductive hydrogenated amorphous silicon carbide films with multiplasma–zone apparatus", 65 J. Appl. Phys. 6 (1989), pp. 2439–2444.

Tsai, et al., "Control of Silicon Network Structure in Plasma Deposition", J. Non–Crystalline Solids 114 (1989), pp. 151–153.

Koynov, et al., "Properties and stability of hydrogenated amorphous silicon films with a low hydrogen content prepared by cyclic chemical vapour deposition and hydrogenation", Materials Science & Engineering B17 (1993), pp. 82–86.

*Primary Examiner*—Brian Dutton
*Attorney, Agent, or Firm*—Barnes & Thornburg

[57] ABSTRACT

The invention relates to a method of manufacturing microcrystalline layers from elements of the principal group IV, particularly Si, Ge, Sn or their alloys such as SiC or SiGe by means of cyclic CVD or related methods, a cycle comprising two steps. a first step for producing an amorphous layer of the element in such a way that compounds and hydrogen are passed under conventional CVD conditions through separate access means into the reactor over the substrate, and in that in a second step, a hydrogen treatment takes place, the supply of the process gas flow, the hydrogen flow and the connection of the CVD reactor to the pump being closed at least intermittently during the second step, so that the hydrogen treatment takes place in a closed CVD process (CC-CVD process) with the quantity of hydrogen or element hydrogen compounds located in the reactor.

19 Claims, 6 Drawing Sheets

METHOD OF MANUFACTURING MICROCRYSTALLINE LAYERS AND THEIR UTILIZATION

RELATED APPLICATION

This application is a 35 U.S.C. § 371 application of PCT/DE94/01158, filed on Sep. 29, 1994.

BACKGROUND AND SUMMARY OF THE INVENTION

The invention relates to a method of manufacturing microcrystalline layers from elements of the fourth principal group of the periodic system, such as silicon, germanium or tin, and to a method of manufacturing luminescent silicon structures, solar cells and transistors.

The invention further relates to the layers or products manufactured according to these methods.

Microcrystalline layers, particularly of silicon, due to their optical and electronic properties and also due to the possibility of separating the layers at lower temperatures (200° to 300° C.) are becoming increasingly important. Preferred fields of application for such layers are solar cells and thin layer transistors like LEDs.

A conventional method for separating microcrystalline silicon ($\mu$c-Si) is the CVD method. Manufacture of the layers in this case is undertaken by using $SiH_4$ in hydrogen as a process gas. $SiH_4$ is used in an intensely diluted form in hydrogen (less than 5% by volume) (T. Hamasaki, H. Kurata, M. Hirose, Ul. Osaka, Appl. Phys. Lett. 37 (1980) 1084). The low temperature formation of the crystalline phase may in this case be understood to be an equilibrium between the silicon deposition and the removal of the regions with unsequenced Si-Si bonds by the atomic hydrogen. This process is termed hydrogen etching (C. C. Tsai, G. B. Anderson, R. Thompson, B. Wacker, J. Non-Cryst. Sol. 114 (1989) 151). A problem of this conventional PE-CVD is that the growth of the sequenced microcrystalline Si layer requires mild plasma conditions, in comparison to which the production of the required atomic hydrogen requires for hydrogen etching a high pressure and a high power of the hydrogen plasma. Another problem is that the deposition rate is very low at 0.5 to 1 nm/min (5 to 10 Å/min).

In order to solve this problem, in the interim a plurality of cyclic methods of manufacturing $\mu$c-Si:H and related layers such as $\mu$c-Si:Ge:H have been proposed, all of which provide for a separation into two process steps. According to this, in a first step, for example, an amorphous SiH layer is deposited under the conditions favorable for Si deposition, and then in a second step the hydrogen etching is undertaken under the conditions necessary for hydrogen etching (A. Asano, T. Ichimura, H. Sakai, J. Appl. Phys. 65 (1989) 2439. A. Asano, Appl. Phys. Lett. 56 (1990) 533). Hydrogen treatment is carried out in such a way that a constant flow of hydrogen is passed into the CVD reactor over the substrate.

It has however become apparent that even this cyclic method does not provide satisfying results as regards the deposition rate. A further disadvantage is that the step of hydrogen etching is extremely difficult to control.

Proceeding from this prior art the object of the present invention is to propose a new cyclic method for a deposition of microcrystalline layers from elements of the IVth principal group, by means of which it is possible better to control the step of hydrogen etching and to achieve clearly higher deposition rates than were previously possible. A further object of the present invention is to propose applications of interest with such layers.

It has become surprisingly apparent that, when the conventional method for manufacturing the microcrystalline layers, in the second process step, i.e., during hydrogen treatment, is so converted that the hydrogen treatment is carried out in a closed system, clearly higher deposition rates are achieved. The microcrystalline layers produced in this way are particularly characterized in that the microcrystalline layer has a crystallite proportion of 20 to 95%, so called element dots, i.e., spatially defined crystallites, being formed.

The procedure in the hydrogen treatment according to the invention is such that, after deposition of the amorphous layer, with conventional process gases and under conventional conditions, the process gas flow and the hydrogen flow, as well as the connection of the CVD reactor to the pump are at least intermittently interrupted. Hydrogen treatment is effected with the quantity of hydrogen still remaining in the reactor. However, the procedure is more preferably such that the hydrogen flow is turned off with a chronological time delay, so that an increased proportion of hydrogen is present in the reactor. By virtue of the fact that the hydrogen is present in a closed system, conversion of the amorphous layer to a microcrystalline layer is reinforced. The decomposition of $SiH_4$ in extreme hydrogen dilution in the plasma is a reversible process, which may be expressed by the following equation:

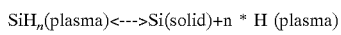

$$SiH_n(\text{plasma}) \longleftrightarrow Si(\text{solid}) + n * H \text{ (plasma)}$$

Accordingly, the silicon atoms are etched out of the amorphous solid silicon phase by the hydrogen atoms, and $SiH_n$ radicals form. As the attack of the hydrogen atoms takes place at preferred points at the amorphous silicon layer, there also form corresponding microcrystalline layers at preferred points. By virtue of the fact that operation is in a closed system, it is ensured that the $SiH_n$ gas species forming in the reactor are not removed from the system by the continuous hydrogen flow, but that a so to speak stationary condition is achieved, so that an increased deposition rate can be obtained.

It is therefore more preferably proposed that the hydrogen proportion be increased, so that acceleration of the etching takes place and a once again clearly increased deposition rate is achieved. This is achieved by the fact that in the second step the process gas flow and the hydrogen flow as well as the connection to the vacuum pump are not interrupted simultaneously, but that the hydrogen flow can run into the reactor for a slightly longer period at a maximum until pressure increase in the reactor of up to 1 atmosphere takes place. The method offers the further advantage that, due to the duration of the hydrogen treatment, the crystallite proportion may be individually controlled. The crystallite proportion which may be obtained by the method according to the invention, is a maximum of 95%. In addition, by selection of the process parameters, the size of the crystallites may be adjusted.

A process described above is termed a closed-container chemical vapor deposition (CC-CVD) process. Accordingly the CC-CVD process comprises a repeatable cycle, each cycle comprising two steps, namely a) the deposition of a thin amorphous silicon layer, and b) a hydrogen treatment in a closed CVD process as described above.

An advantageous factor in the method according to the invention is that a plurality of cycles may be carried out in succession in one process. Depending on the layer thickness required, 2 to 2,000 cycles may be carried out, so the desired layer thickness may be produced.

The above named process may be basically carried out with all current CVD methods. Among these are ECR-CVD, VHF-CVD and hot wire CVD-processes. It is also possible to use different CVD methods in the individual steps of each cycle.

It is preferred if the method according to the invention is carried out with silicon as an element and $SiH_4$ and hydrogen as process gases.

The method described above is particularly suitable for manufacturing luminescent element structures, particularly for manufacturing luminescent Si structures.

Luminescence is the emission of light in the visible range, in the UV and the IR spectral range, among others, by solid bodies after supply of energy. Luminescence is ascribed to a transition of one electron from an energetically higher condition into an unoccupied energetically lower conditions. As unoccupied electron conditions are often treated as positively charged "holes", the luminescence may also be described as recombination of an electron-hole pair in which the energy released is emitted at least partly in the form of a quantum of light (photon).

Luminescent processes may be categorized depending on the type of energy supply into photoluminescence (optical excitement) and electroluminescence (application of a voltage through an electric field).

The phenomenon of luminescence is of particular interest in semi-conductive materials, as in this way various applications are made possible in microelectronics. For a long period, it was thought that the only semi-conductive materials that are suitable for light emission are those which have a direct band transition. Typical materials of such a direct band transition are, for example, gas combination semi-conductors. In contrast to this, silicon is a semiconductor material with an indirect band transition. It was therefore to be expected that silicon would not be available for electroluminescent applications. In recent times however, various methods and processes have become known which enable production of an electroluminescent Si structure.

All these operations are based on Si wafers which are anodized in a hydrofluoric acid bath, in order in this way to produce micro-porous Si structures.

A method of this type is described in DE-OS 41 26 955. The electroluminescent Si structure is generated in such a way that during anodization of the Si wafer in the acid bath, the Si wafer is illuminated on the anodic side at least partly over a specific period of time. In this way it is intended that Si structures shall be obtained after further process steps which will reveal electroluminescence after application of an electrical field.

In the document U.S. Pat. No. 5,206,523 there is likewise revealed a micro-porous Si structure, which is likewise produced by an acid treatment. In this case, by means of anodizing in a hydrofluoric electrolyte, so-called quantum wires are intended to be produced, which result in an alteration in the energetic band spacing of the micro-porous Si structure in comparison to crystalline silicon.

All the methods in prior art accordingly proceed from the fact that electroluminescence is only achieved if Si wafers are anodized in an aqueous hydrofluoric acid bath in order to produce micro-porous Si layers.

This procedure however is not only complex to handle, but also has disadvantages in relation to the structuring of the surface and the layer thickness. In the prior art methods it is mainly not possible to treat Si layers of any thickness with the acid bath. The acid process requires precisely fixed parameters both in relation to the control of the bath and on the Si wafer. Thus it is not possible to increase the luminescent effect through particularly thick layers. The efficiency of the layers produced by the methods in prior art as regards electroluminescent effect therefore leaves much to be desired.

It is now proposed according to the invention to proceed from the basis of the microcrystalline layers described above.

Basically, two methods are available of processing the microcrystalline layers manufactured in this way, in order to enable luminescent applications.

Either the microcrystalline layers produced as described above are subjected to a conventional wet-chemical etching process or passivation of the element dots is effected under closed chamber conditions.

In particular, a variant of the method according to the invention described above for processing the microcrystalline layers under closed chamber conditions has proved advantageous. The advantage in this case is that a plurality of these layers may be generated one above the other (multi-layers), so that electroluminescence with an extremely high degree of efficiency may be achieved. A further improvement may be achieved by the use of insulating layers, e.g., of a-SiC:H or a-SiN:H, as an initiating contact. In this case the charge carriers pass through tunnels into the active layer (AL) and arrive at that point with extremely high energy. Thus, a renewed increase in efficiency is achieved. A further improvement in yield is achieved by repetition of the active layers (AL) and insulating layers (IL).

In addition to the manufacture of luminescent element structures, the method already described for producing microcrystalline layers is particularly suitable also for the manufacture of solar cells and for making high-performance thin layer transistors.

Further details, features and advantages of the invention will become apparent from the following description of an example of the method according to the invention.

BRIEF DESCRIPTION OF THE DRAWINGS

The detailed description is with reference to the drawings, which show.

DETAILED DESCRIPTION

Figure 1:
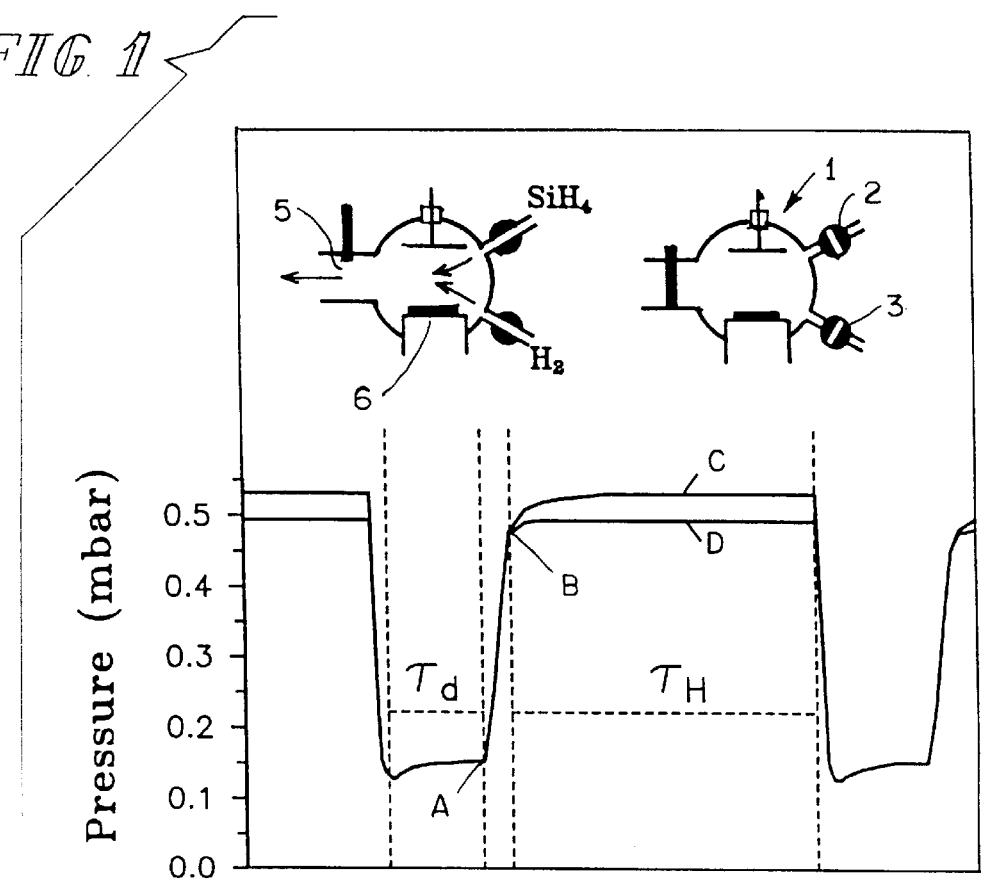
FIG. 1 is a schematic view of the CVD-reactor in both the first and the second process steps, with the associated process parameters.
Figure 1:
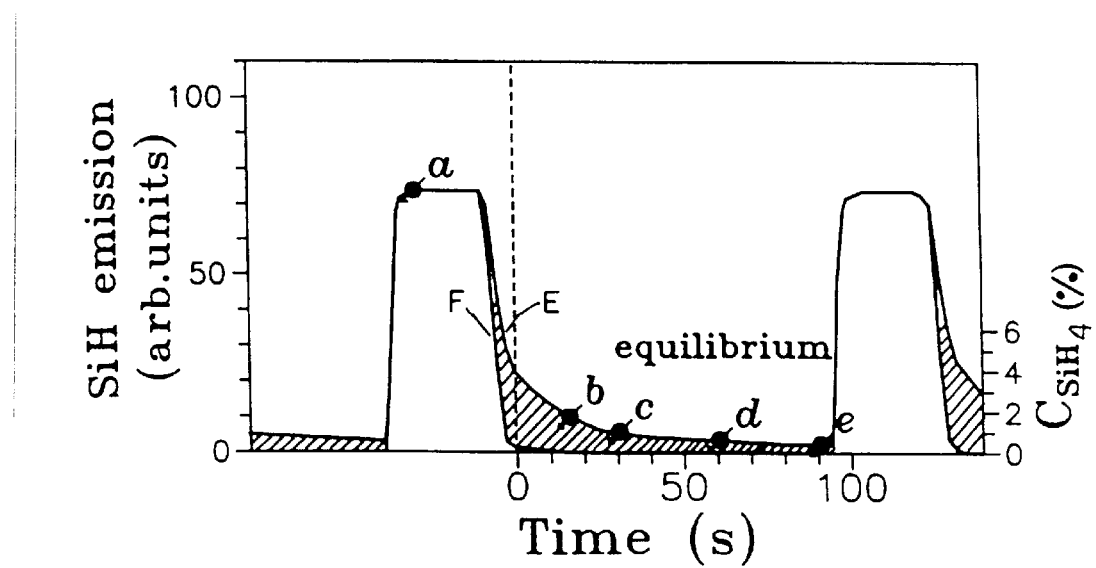

FIG. 1 shows schematically in the upper portion of the double graph the condition of the reaction chamber of a CVD reactor for the two process steps. The example relates to the deposition of silicon by means of $SiH_4$ as a process gas and hydrogen.

The reactor 1 is provided with an access means 2 for the process gas, in this case $SiH_4$ and a separate access means for the hydrogen. The reactor 1 is connected through the outlet 5 to a pump (not shown). The first step, the deposition of an amorphous SiH layer, is carried out under known conditions which are conventional per se with the known process gases SiH$_4$ and hydrogen. The outlet 5 to the pump is open, so that deposition on the substrate 6 is undertaken in the gas flow (in s). The pressure in mbars can be seen on the ordinate. The conditions for the deposition of the a-Si:H layer were as follows:

overall gas flow 22 sccm (5 sccm SiH$_4$+17 sccm H$_2$),
gas pressure 0.15 mbar,
power 0.2 W/cm$^2$, and
substrate temperature 270° C.

Under these conditions, the deposition rate was 0.25 nm/s (2.5 Å/s). In order to provide a better view of the process procedures, a period of time of 35 seconds was selected as the time period ($T_d$). It is however sufficient if $T_d$ comes to approximately 5 seconds. Thus it is possible to generate in each cycle a-Si:H layers 1.24 nm (12.4 Å) thick.

The essential feature of the invention is the second step of the cycle for generating the microcrystalline layers. For this purpose the outlet 5 to the pump and the inlets 2 and 3 for the process gas flow and the hydrogen are closed for a specific time period $T_H$. In the case of this example, the procedure was such that interruption of the hydrogen flow (switch point B) was undertaken chronologically after the interruption of the process gas flow and closure of the outlet to the pump (switch point A). This achieves a situation in which, due to the subsequently-flowing hydrogen, the pressure in the reactor increases, so that the hydrogen treatment is carried out with an increased proportion of hydrogen, enabling an acceleration of the second process step.

The curve C within the time interval $T_H$ in this case shows the pressure configuration, as it occurs in the CC-hydrogen treatment. D shows the configuration as carried out with the plasma switch off, or in an open process, i.e., in the process known from prior art. The lower portion of the double graph shows the effect of this difference. E shows the configuration for the CC-process according to the invention, and F the configuration in the "open process" known from prior art. In this way it becomes clear (shaded area) that, during the CC process, contrary to the open process, SiH$_4$ molecules are still present in the gas space. In a conventional cyclic process, the SiH$_4$ concentration at the beginning of the second step, i.e., during the oxygen treatment, is zero (curve F). In this case, accordingly, the hydrogen treatment takes place in a pure hydrogen atmosphere. In contrast to this, the hydrogen treatment in the CC-CVD process takes place in the presence of SiH$_4$ molecules. This circumstance clearly has a positive effect on the deposition rate.

In order to clarify the process, various samples were tested during the first and second cycle (a to e and i). These results were compared to samples which had been manufactured in an open process (f to h) (Table 1). Therein, $T_H$ means the period of time of the hydrogen treatment, $\Delta d$ the layer thickness per cycle, R the deposition rate, $\sigma_d$ the overall film thickness, beta$_b$ the darkness, and $\sigma_{ph}$ the photoconductivity, and $E_{act}$ the activation energy. This makes it clear that by means of the method according to the invention deposition rates are achieved which are higher by a factor of 5 than can be achieved by previous conventional methods. In addition, conductivities are achieved which are better than prior art by several powers of 10.

Figure 2:
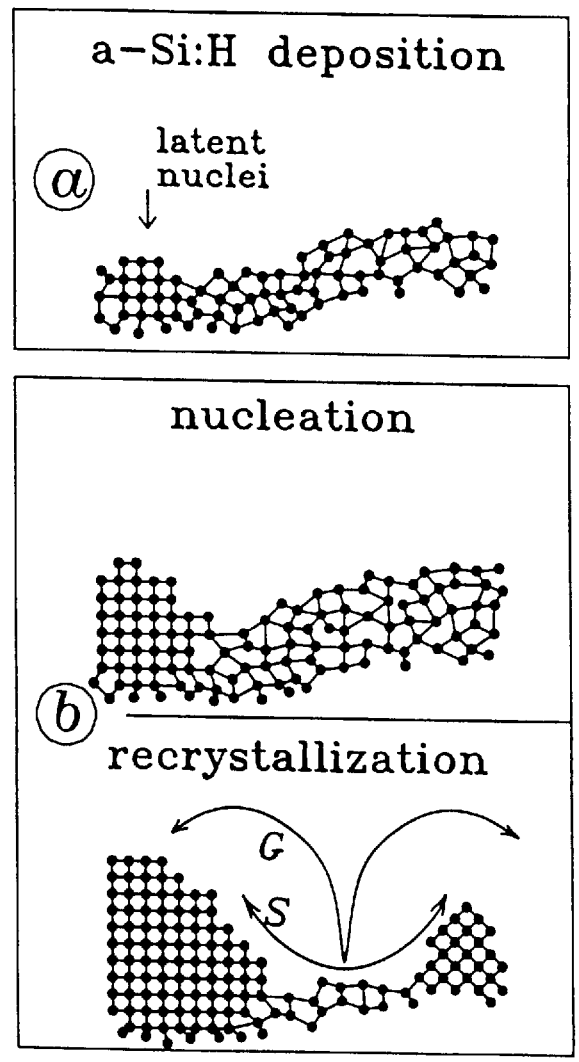
FIG. 2 is a schematic view of two selected regions during the process for formation of the microcrystalline layer.

FIG. 2 shows schematically the formation of the microcrystalline layer, proceeding from the amorphous layer (a) to the microcrystalline layer (b). By means of the first process step of the cycle, an amorphous SiH layer is formed. This amorphous SiH layer contains partially sequenced areas (see arrow).

In the following hydrogen treatment in the closed system (b) there forms, proceeding from the partially sequenced areas indicated in (a), the microcrystalline layer; this procedure may be explained in that it takes place in two stages. A first stage in this case is known as "nucleation" and a second stage known as "recrystallization". G and S symbolize silicon atoms in the gas phase (G) and the SiH species (S).

Figure 3:
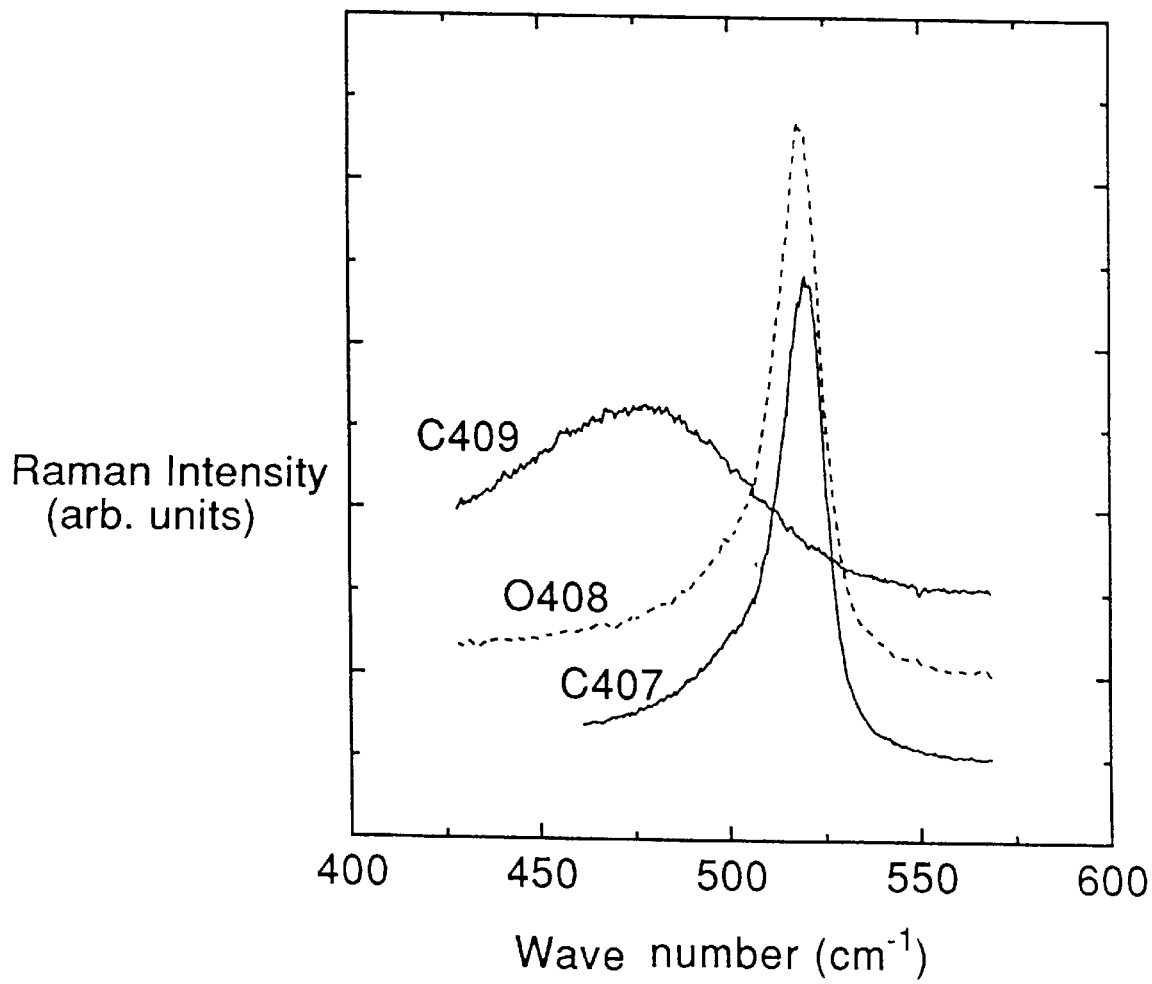
FIG. 3 shows a Raman spectrum for two different samples.

FIG. 3 shows in comparison the Raman spectrums of two samples produced by the method according to the invention. The Raman spectrum shows a curve A of sample C409, treated for 15 seconds, and a curve B (sample C407) treated for 90 seconds with H2, and a curve C, sample 0408. From this it can be seen that the method according to the invention, as regards the formation of crystals, is extremely flexible. The Raman intensity is entered on the ordinate.

Figure 4:
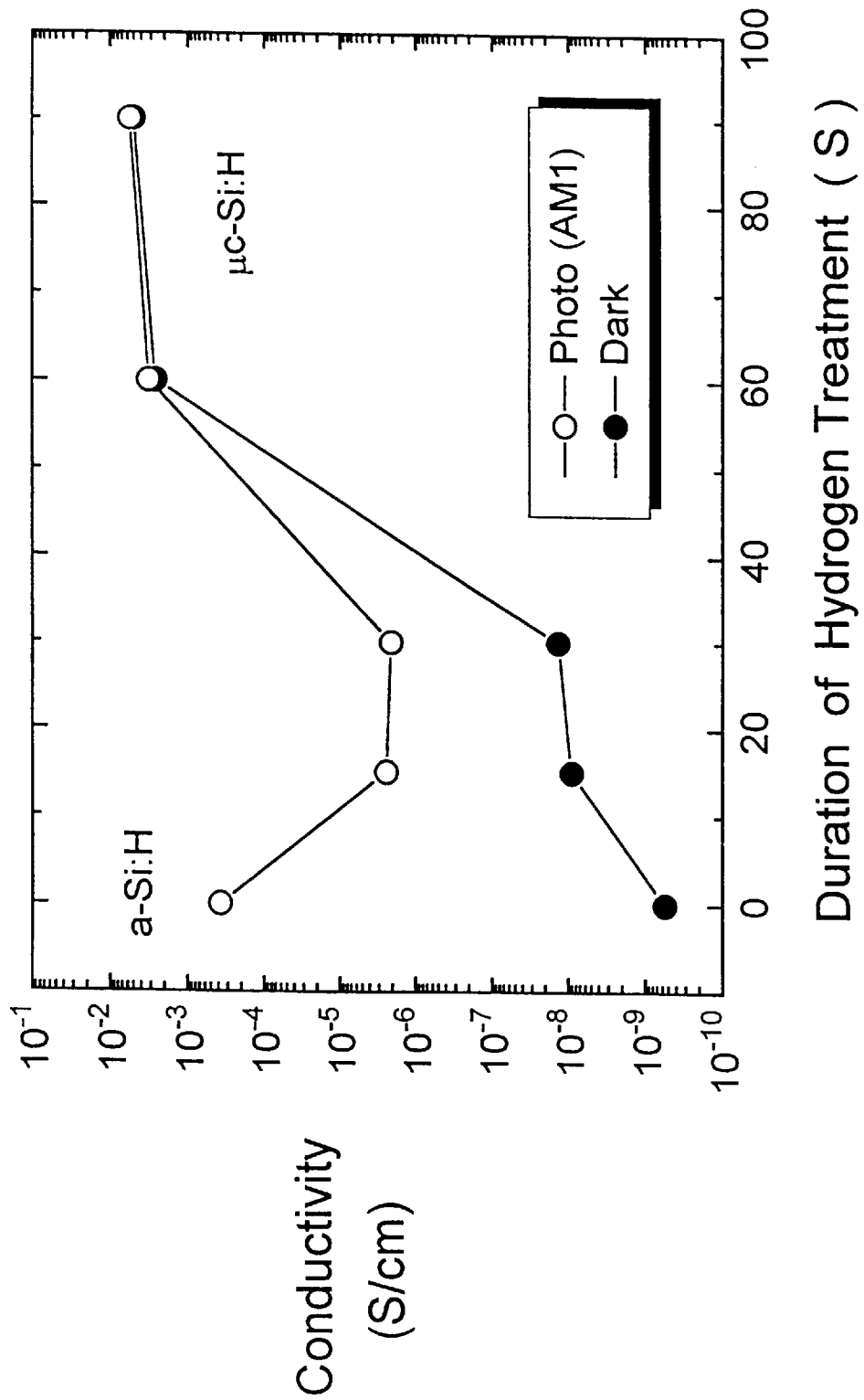
FIG. 4 shows the conductivity of the layer manufactured according to the invention.

FIG. 4 shows the increase in conductivity (in s/cm) with the progress of the hydrogen treatment in s. This is particularly advantageous for microcrystalline TFT's.

Figure 5:
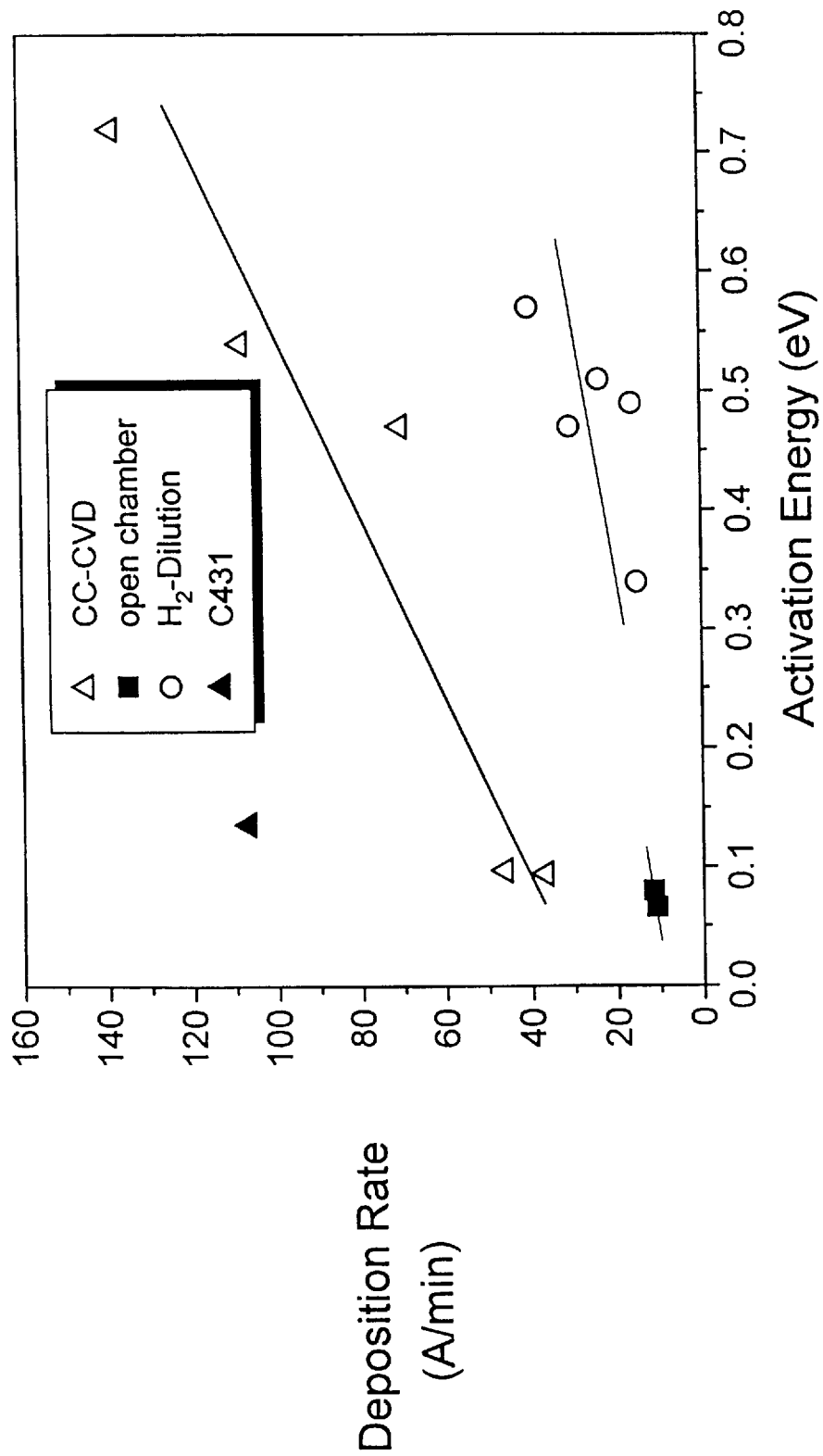
FIG. 5 shows the deposition rate.

FIG. 5 shows how the deposition rate (nm/min) of the method according to the invention (symbolized by solid triangles) differs from the open process (solid squares). For the sake of completeness, the hydrogen dilution is also entered in this graph.

The activation energy is entered on the abscissa.

These results show that the microcrystalline layers produced with the method according to the invention are clearly superior to those in prior art. With these layers application has become possible both for luminescence and for transistors or solar cells.

FIG. 6 shows the application of the microcrystalline layers described above for luminescent applications.

Figure 6A:
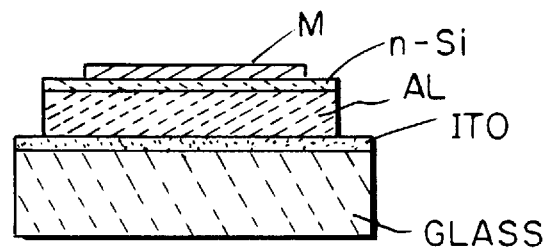
FIG. 6 shows various embodiments of luminescent Si structures.

FIG. 6(a) shows the structure of a pn-diode. In order to manufacture this pn-diode, the procedure is such that a substrate, preferably glass or other at least partially translucent substrates, are provided with a contact electrode layer. Such a substrate is provided with a microcrystalline layer by means of the CC-CVD process described above. According to the invention the procedure is such that at least one cycle, but preferably 2 to 2000 cycles are carried out, so that a layer of sufficient thickness is obtained. By virtue of the fact that the microcrystalline layer is produced by means of the CC-CVD process, it is no longer necessary as was known in prior art, to form the microcrystalline layer for luminescent applications from Si-wafers in such a way that a surface of a wafer is treated.

According to the invention, the microcrystalline layer produced in this way is passivised in a further process step, preferably with the CC-CVD process. Passivation may also be carried out in a "normal," i.e., CVD, process. Accordingly, a cycle comprises three steps, i.e., formation of the amorphous SiH layer, production of the microcrystalline layer and passivation. The procedure is therefore such that the microcrystalline layers are treated either with an oxidizing or with a nitrating gas. In this way so-called active layers (AL) are formed.

In a variant of the method described above it is also possible to treat the microcrystalline layers not by means of nitrating and oxidizing gases, but by conventional etching processes, converting them into active layers.

An active layer produced in this way, in order to produce luminescent applications, is provided again on the surface with a contact electrode layer. In the case of the example (FIG. 6(a)) the contact electrode layer is N-conductive with a metal contact. The contact electrode layer applied to the substrate the case of this example according to FIG. 6(a) comprises ITO (indium tin oxide). When direct current is applied to such a pn-diode, electro-luminescence was observed.

Figure 6B:
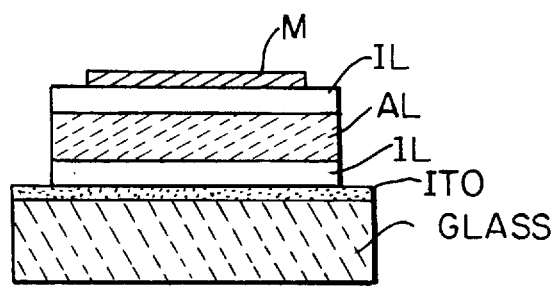

An improvement in the efficiency of the electro-luminescence may be achieved (FIG. 6(b)) in that insulating layers are applied. FIG. 6(b) shows an example of the structure of such an electro-luminescent application. In this case an indium-tinoxide contact electrode is applied to the glass substrate as in FIG. 6(a). The active layer AL, however, is surrounded by two insulating layers IL. The thickness of such a layer lies in the range between 2 to 50 nm (20 to 500 Å). Such an insulating layer may for example comprise amorphous SiC:H or amorphous SiN:H. If alternating voltage is applied, the charge carriers pass through tunnels into the active layer and arrive at this point with high energy. The following are important parameters for this ac operation:

a) voltage (determined by the thickness and combination of the insulating layer), and b) frequency (determined by the transport properties and the constitutional density of the active material).

Electroluminescence in such a structure shows a clearly better efficiency than the pn-diode according to FIG. 6(a).

Figure 6C:
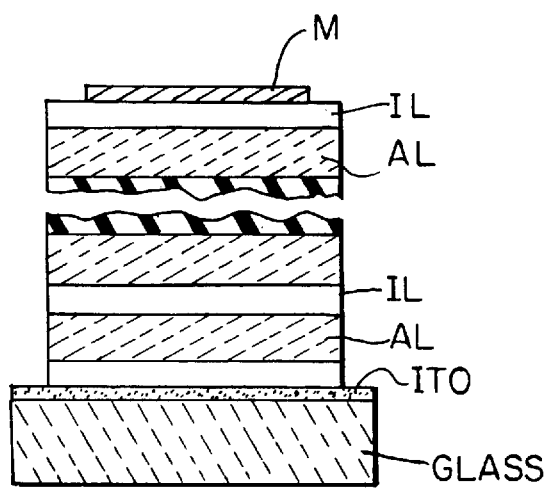

A further increase may be achieved by so called multi-layers (FIG. 6(c)). In such a structure, by means of repetition of the active and insulating layers, a further clear increase in yield is achieved. The operational voltage increases accordingly.

| Sample | Type | $T_H$ (s) | $\Delta d$ (nm) | R (nm/min) | d ($\mu$m) | $\sigma_d$ (S/cm) | $\sigma_{ph}$(AMI) (S/cm) | $E_{act}$ (eV) |
|---|---|---|---|---|---|---|---|---|
| a | S380 | 0 | 1.2 | 14.8 | 1.78 | $5.6*10^{-10}$ | $3.8*10^{-4}$ | 0.72 |
| b | C409 | closed | 15 | 6.3 | 10.8 | 0.70 | $9.0*10^{-9}$ | $2.4*10^{-6}$ | 0.54 |
| c | C405 | closed | 30 | 5.9 | 7.0 | 0.65 | $1.4*10^{-8}$ | $2.1*10^{-6}$ | 0.47 |
| d | C404 | closed | 60 | 6.1 | 4.6 | 0.68 | $2.6*10^{-3}$ | $3.2*10^{-3}$ | 0.10 |
| e | C407 | closed | 90 | 6.7 | 3.7 | 0.75 | $5.0*10^{-3}$ | $5.6*10^{-3}$ | 0.09 |
| f | O408 | open | 15 | 0.8 | 1.2 | 0.25 | $8.3*10^{-4}$ | $1.2*10^{-3}$ | 0.08 |
| g | O406 | open | 30 | 0.9 | 0.1 | 0.12 | $0.7*10^{-3}$ | $4.6*10^{-3}$ | 0.07 |
| h | O403 | open | 90 | 0 | 0 | 0 | — | — | — |
| i | C431 | closed$^{(\alpha)}$ | 60 | 12.7 | 10.7 | 0.70 | $2.8*10^{-4}$ | $3.6*10^{-4}$ | 0.14 |

We claim:

1. A method of manufacturing microcrystalline layers from an element of the principal group IV with cyclic CVD in a reactor connected to a pump, the method comprising separately supplying hydrogen and a process gas into the reactor and producing an amorphous layer of the element under CVD conditions, and interrupting the supply of hydrogen, the supply of process gas and the connection to the pump and treating the amorphous layer with the hydrogen and the process gas present in the reactor in a closed CVD process to form a microcrystalline layer.

2. The method according to claim 1 wherein the supply of hydrogen is interrupted chronologically after interrupting the supply of process gas and the connection to the pump.

3. The method according to claim 1 wherein the supply of hydrogen is interrupted when the pressure in the reactor has risen to about 1 atmosphere.

4. The method according to claim 2 wherein the supply of hydrogen is interrupted when the pressure in the reactor has risen to about 1 atmosphere.

5. The method according to claim 1 wherein a crystallite proportion relative to an amorphous proportion of the microcrystalline layers is controlled by the duration of treating the amorphous layer with an amount of hydrogen and process gas present in the reactor in a closed CVD process.

6. The method according to claim 5 wherein the crystallite proportion is in the range between about 20% and about 95% relative to the amorphous proportion.

7. The method according to claim 2 wherein a crystallite proportion relative to an amorphous proportion of the microcrystalline layers is controlled by the duration of treating the amorphous layer with an amount of hydrogen and process gas present in the reactor in a closed CVD process.

8. The method according to claim 7 wherein the crystallite proportion is in the range between about 20% and about 95% relative to the amorphous proportion.

9. The method according to claim 1 wherein a cycle comprising supplying hydrogen and a process gas into the reactor and producing an amorphous layer of the element under CVD conditions, and at least intermittently interrupting the supply of hydrogen, the supply of process gas and the connection to the pump and treating the amorphous layer with an amount of hydrogen and process gas present in the reactor in a closed CVD process to form a microcrystalline layer is repeated 2 to 2000 times.

10. The method according to claim 2 wherein a cycle comprising supplying hydrogen and a process gas into the reactor and producing an amorphous layer of the element under CVD conditions, and at least intermittently interrupting the supply of hydrogen, the supply of process gas and the connection to the pump and treating the amorphous layer with an amount of hydrogen and process gas present in the reactor in a closed CVD process to form a microcrystalline layer is repeated 2 to 2000 times.

11. The method according to claim 3 wherein a cycle comprising supplying hydrogen and a process gas into the reactor and producing an amorphous layer of the element under CVD conditions, and at least intermittently interrupting the supply of hydrogen, the supply of process gas and the connection to the pump and treating the amorphous layer with an amount of hydrogen and process gas present in the reactor in a closed CVD process to form a microcrystalline layer is repeated 2 to 2000 times.

12. The method according to claim 4 wherein a cycle comprising supplying hydrogen and a process gas into the reactor and producing an amorphous layer of the element under CVD conditions, and at least intermittently interrupting the supply of hydrogen, the supply of process gas and the connection to the pump and treating the amorphous layer with an amount of hydrogen and process gas present in the reactor in a closed CVD process to form a microcrystalline layer is repeated 2 to 2000 times.

13. The method according to claim 1 wherein the microcrystalline layers are manufactured by a process selected from the group consisting of ECR-CVD, VHF-CVD and hot-wire processes.

14. The method according to claim 2 wherein the microcrystalline layers are manufactured by a process selected from the group consisting of ECR-CVD, VHF-CVD and hot-wire processes.

15. The method according to claim 3 wherein the microcrystalline layers are manufactured by a process selected from the group consisting of ECR-CVD, VHF-CVD and hot-wire processes.

16. The method according to claim 1 wherein the process gas is an element-hydrogen compound.

17. The method according to claim 2 wherein the process gas is an element-hydrogen compound.

18. The method according to claim 3 wherein the element of the principal group IV is selected from the group consisting of Si, Ge and Sn.

19. The method according to claim 16 wherein the element of the principal group IV is selected from the group consisting of Si, Ge and Sn.

* * * * *